United States Patent [19]
Liu et al.

[11] Patent Number: 6,118,136
[45] Date of Patent: Sep. 12, 2000

[54] SUPERLATTICED NEGATIVE-DIFFERENTIAL-RESISTANCE FUNCTIONAL TRANSISTOR

[75] Inventors: Wen-Chau Liu; Shiou-Ying Cheng, both of Tai-Nan, Taiwan

[73] Assignee: National Science Council of Republic of China, Taipei, Taiwan

[21] Appl. No.: 09/126,758

[22] Filed: Jul. 31, 1998

[51] Int. Cl.[7] .................. H01L 31/072; H01L 31/109; H01L 31/0328; H01L 31/0336
[52] U.S. Cl. .................. 257/17; 257/22; 257/25; 257/183; 257/197; 257/198; 438/312
[58] Field of Search .................. 257/197, 198, 257/25, 22, 17, 183; 438/312

[56] References Cited

U.S. PATENT DOCUMENTS

| | | | |
|---|---|---|---|
| 5,389,804 | 2/1995 | Yokoyama et al. | 257/197 |
| 5,414,273 | 5/1995 | Shimura et al. | 257/17 |
| 5,432,362 | 7/1995 | Lippens et al. | 257/197 |
| 5,459,331 | 10/1995 | Izumi | 257/17 |
| 5,828,077 | 10/1998 | Liu et al. | 257/25 |
| 5,939,729 | 8/1999 | Chu et al. | 257/25 |

FOREIGN PATENT DOCUMENTS

| | | |
|---|---|---|
| 362137868 | 6/1987 | Japan . |
| 403014240 | 1/1991 | Japan . |
| 410041320 | 2/1998 | Japan . |
| 410144699 | 5/1998 | Japan . |

OTHER PUBLICATIONS

Yang et al., IEEE Transactions on Electron Devices, 42: 1047–1058 (1995).
Song et al., IEEE Electron Device Letters, 15: 94–96 (1994).
Fukano et al., IEEE Electron Device Letters, 9: 312–314 (1988).
Klausmeier–Brown et al., IEEE 1988 Bipolar Circuits & Technology Meeting, Paper 2.1, 33–36.
Liu et al., IEEE Electron Device Letters, 12: 474–476 (1991).
Liu et al., IEEE Electron Device Letters, 18: 515–517 (1997).
Won et al., IEEE Electron Device Letters, 10: 138–140 (1989).

*Primary Examiner*—William Mintel
*Attorney, Agent, or Firm*—Bacon & Thomas, PLLC

[57] ABSTRACT

The invention is to develop a high-speed low power consumption resonant tunneling element—a superlatticed negative-differential-resistance (NDR) functional transistor. The proposed element exhibits amplification and obvious NDR phenomena simultaneously. In this element, the emitter region includes 5-period GaInAs/AlInAs super lattice resonant tunneling and emitter layers. Since the emitter—base interface is of homojunction, the collector—emitter offset voltage ($V_{CE}$, offset) may be lowered down significantly. In addition, the produced infinitesimal potential ($\Delta Ev$) at GaInAs/AlInAs interface due to heterojunction in discrete valence bands may be applied as barriers to prohibit holes flow from base towards emitter. By doing so, the base current is remarkably depressed so as to elevate efficiency of emitter injection as well as current gain.

12 Claims, 4 Drawing Sheets

SUPERLATTICED NEGATIVE-DIFFERENTIAL-RESISTANCE FUNCTIONAL TRANSISTOR

BACKGROUND OF THE INVENTION

Subsequent to rapid development of compound semiconductor industry, techniques for fabricating ICs and photoelectric elements are also moving forward to a new milestone, in which the high-speed microwave functional elements are always the focused issues. In the booming fields of sophisticated science such as radio data transmission, personal mobile and satellite communication, etc., the compound semiconductor element is playing pivotal key roles.

Materials in lattice-matched to Indium Phosphide (InP) have collected constant attention from the public due to their inherent photoelectric characters, wherein a resonant-tunneling diode (RTD) or a resonant-tunneling transistor (RTT) formed by GaInAs/AlInAs features a negative-differential-resistance with very high operable frequency. Therefore, the RTD or RTT is widely applied in microwave and milli-microwave devices as for analog-to-digital converter parity bit generator frequency multiplier and multiple-valued logic circuit, etc. However, the above mentioned phenomenon of negative-differential-resistance is affected by thermal effect, hence, the element can be applied only under low temperature condition to show off its outstanding features. This disadvantage seriously degrades the practicability of the RTD or RTT element.

Accordingly, the above-described customary element is in need of improvements.

SUMMARY OF THE INVENTION

In view of the drawbacks in the above customary element, the inventors of the present invention have worked for years in improving or innovating, and finally have succeeded to have this superlatticed negative-differential-resistance transistor created.

In the present invention, a crystal grows on an Indium Phosphide substrate to form GaInAs/AlInAs superlatticed negative-differential-resistance transistor. In the emitter region, GaInAs/AlInAs superlatticed layer comes to substitute carrier's confinement layer of conventional heterostructural-emitter type bipolar transistor (HEBT). This region is simultaneously serving as a confinement barrier for minor carrier (hole) and as a resonant-tunneling region of emitter injecting major carrier (electron). Experiments show that the element of the present invention not only has low offset voltage for being a good transistor, ability for current amplification, but also exhibits an interesting N-shaped negative-differential-resistance (N-shaped NDR) phenomenon in the saturation region at room temperature. Since the element can feature N-shaped negative-differential-resistance, it may be applied to frequency divider, parity generator, and multiple-valued logic circuits. In a circuit design, where several pieces may be required traditionally, this may now be accomplished by applying merely a GaInAs/AlInAs negative-differential-resistance transistor of the present invention. Therefore, the present invention is proposed to guide a new direction for the forthcoming unification circuit of high-speed photoelectric functional VLSI. In short, to invent and develop the GaInAs/AlInAs superlatticed negative-differential-resistance transistor is the major object of the present invention.

BRIEF DESCRIPTION OF THE DRAWINGS

The drawings disclose an illustrative embodiment of the present invention, which serves to exemplify the various advantages and objects hereof, and are as follows.

DEFINITIONS OF REFERENCE NUMERALS IN FIGURES

Ga=Gallium, In=Indium, As=Arsenic, Al=Aluminum, P=Phosphor, Au=Gold, Ge=Germanium, Zn=Zinc.

10 GaInAs/AlInAs superlatticed negative-differential-resistance functional transistor.

12 A substrate formed by InP material.

14 A buffer layer formed by GaInAs material.

16 A collector layers formed by GaInAs material.

18 A base layers formed by GaInAs material.

20 an emitter layers formed by GaInAs material.

22 5-period super lattice resonant tunneling layer formed by GaInAs/AlInAs material.

24 An ohmic connection layers formed by GaInAs material.

26 An emitter ohmic connection metallic layer formed by Au-Ge alloy.

28 A base ohmic connection metallic layer formed by Au-Zn alloy.

30 A collector ohmic connection metallic layer formed by Au-Ge alloy.

DETAILED DESCRIPTION OF THE PREFERRED EMBODIMENT

Figure 1:
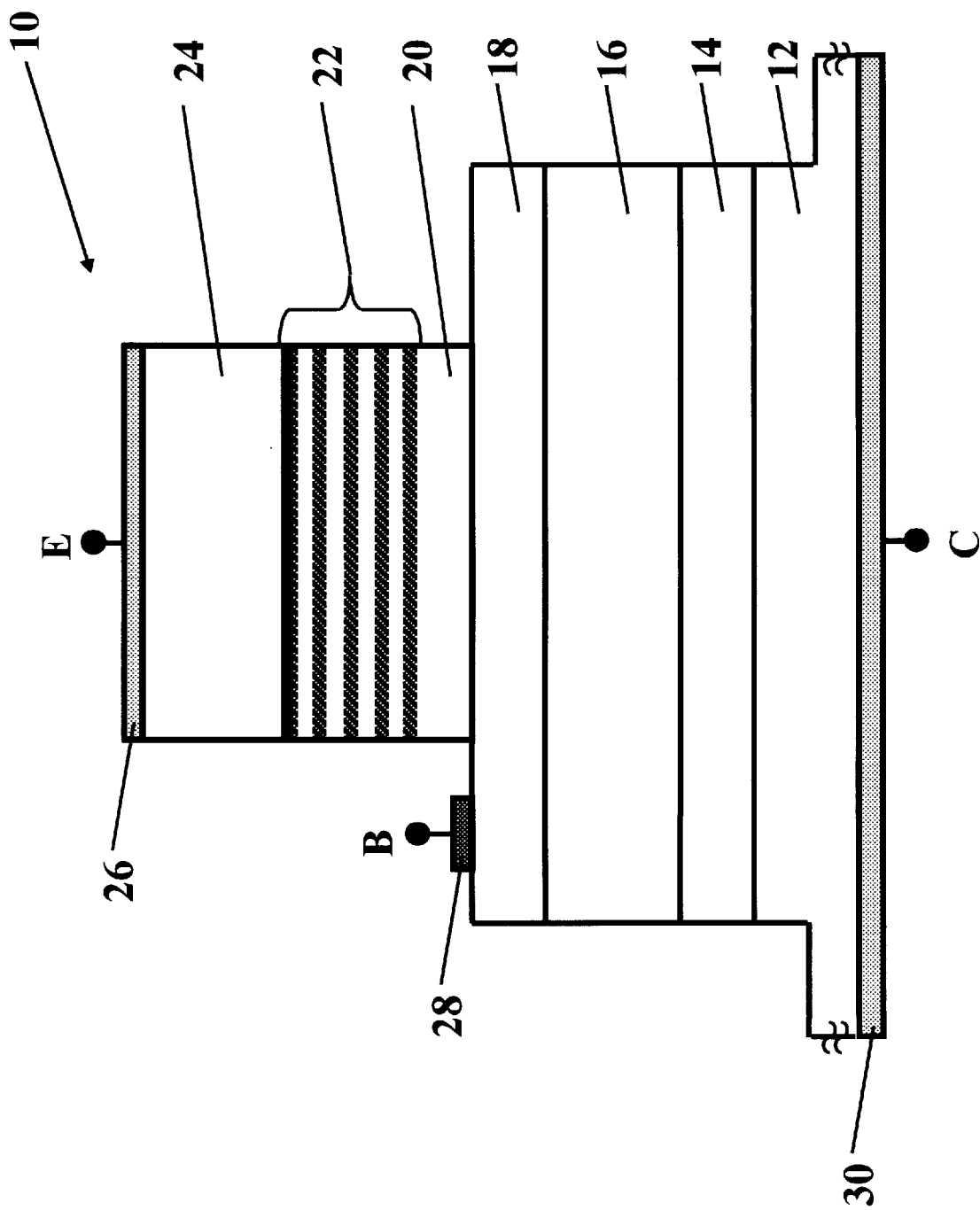
FIG. 1 is a structural view of GaInAs/AlInAs superlatticed negative-differential-resistance functional transistor of the present invention.

FIG. 1 represents an embodiment 10 of a GaInAs/AlInAs superlatticed negative-differential-resistance functional transistor of the present invention. The structure comprises, from bottom to top, $n^+$ type Indium phosphide (InP) substrate 12; thickness at 2000 Å, concentration at $n^+=3\times10^{18}$ $cm^{-3}$, a GaInAs buffer layer 14; thickness at 5000 Å, concentration at $n=5\times10^{16}$ $cm^{-3}$, a GaInAs collector layer 16; thickness at 1000 Å, concentration at $p^+=1\times10^{19}$ $cm^{-3}$, a base layer 18; thickness at 500 Å, concentration at $n=5\times10^{17}$ $cm^{-3}$, a GaInAs emitter layer 20; a 5-period GaInAs/AlInAs super lattice resonant tunneling layer 22 (barrier layer formed by pure material of AlInAs at thickness 50 Å, a quantum well formed by thickness at 50 Å, concentration at $n=5\times10^{17}$ $cm^{-3}$, a GaInAs material); thickness at 3000 Å, concentration at $n=5\times10^{18}$ $cm^{-3}$, a of GaInAs ohmic connection layer 24; thickness at 3000 Å, a Au-Ge alloy emitter ohmic connection metallic layer 26; thickness at 3000 Å an Au—Zn alloy base ohmic connection metallic layer 28; Thickness at 3000 Å an Au-Ge alloy collector ohmic junction metallic layer 30.

The present invention is an up-to-date high-speed GaInAs/AlInAs superlatticed negative-differential-resistance transistor, of which the structure is shown in FIG. 1. The emitter region comprises a 5-period GaInAs/AlInAs super lattice resonant tunneling district and a GaInAs homo-junction emitter layer. Owing to hetero-junction of GaInAs/AlInAs, valence band diswntinuity ($\Delta E_V=0.25$ eV) in valence band can effectively restrain holes moving from base toward emitter for raising efficiency of emitter injection under normal operation mode. Since the thickness of emitter layer is designed to 500 Å, and a homojunction is made between emitter and base, it may thus lower down peak value of barrier potential created by the valence band diswntinuity ($\Delta E_V$=0.5 eV) in conduction band at AlInAs/ GaInAs hetero-junction. Therefore, the collector-base offset voltage may be reduced significantly for the present invention in comparison with a conventional hetero-junction bipolar transistor.

Figure 2:
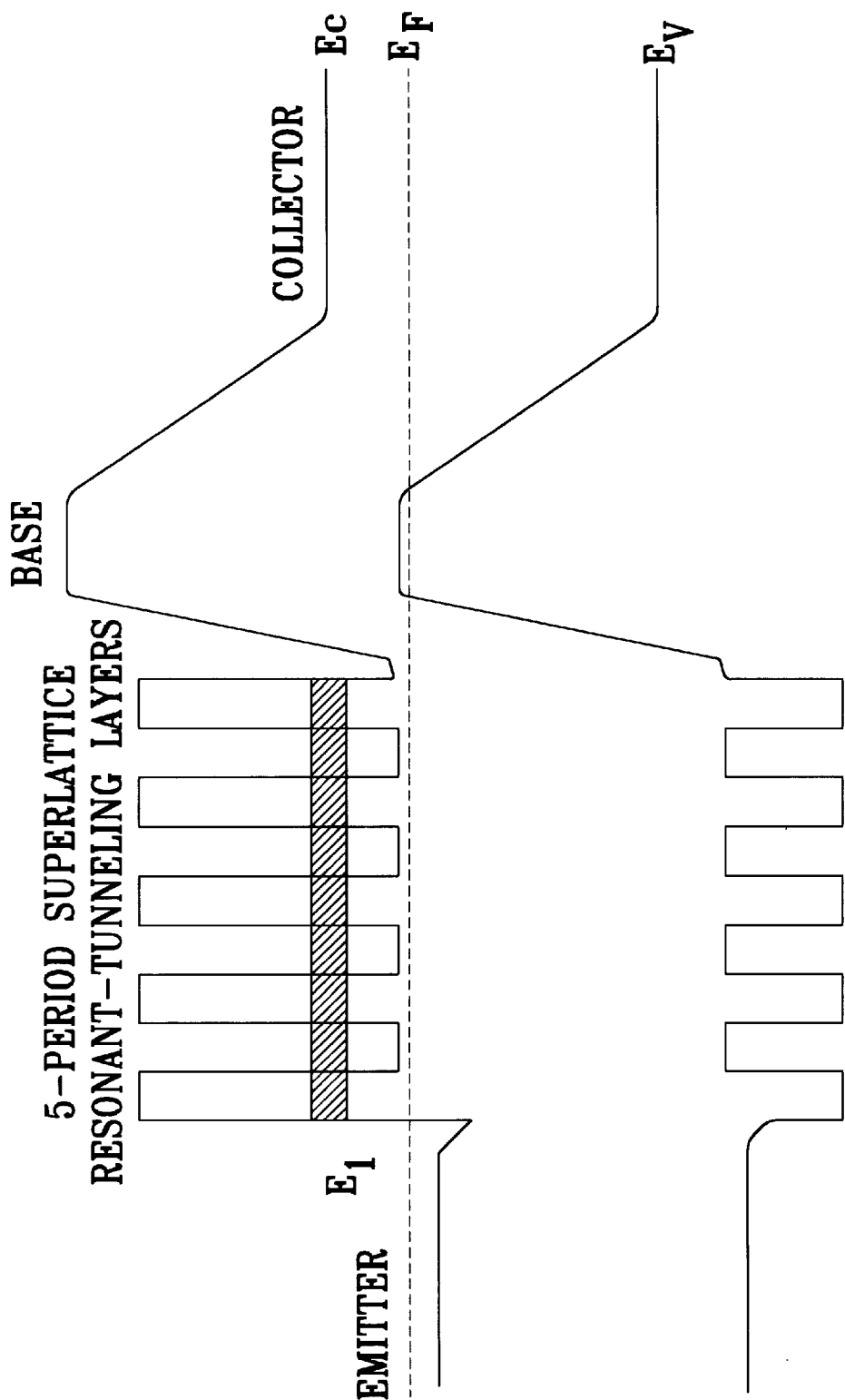
FIG. 2 is an energy band diagram of the GaInAs/AlInAs superlatticed negative-differential-resistance functional transistor under thermal equilibrium of the present invention.
Figure 3:
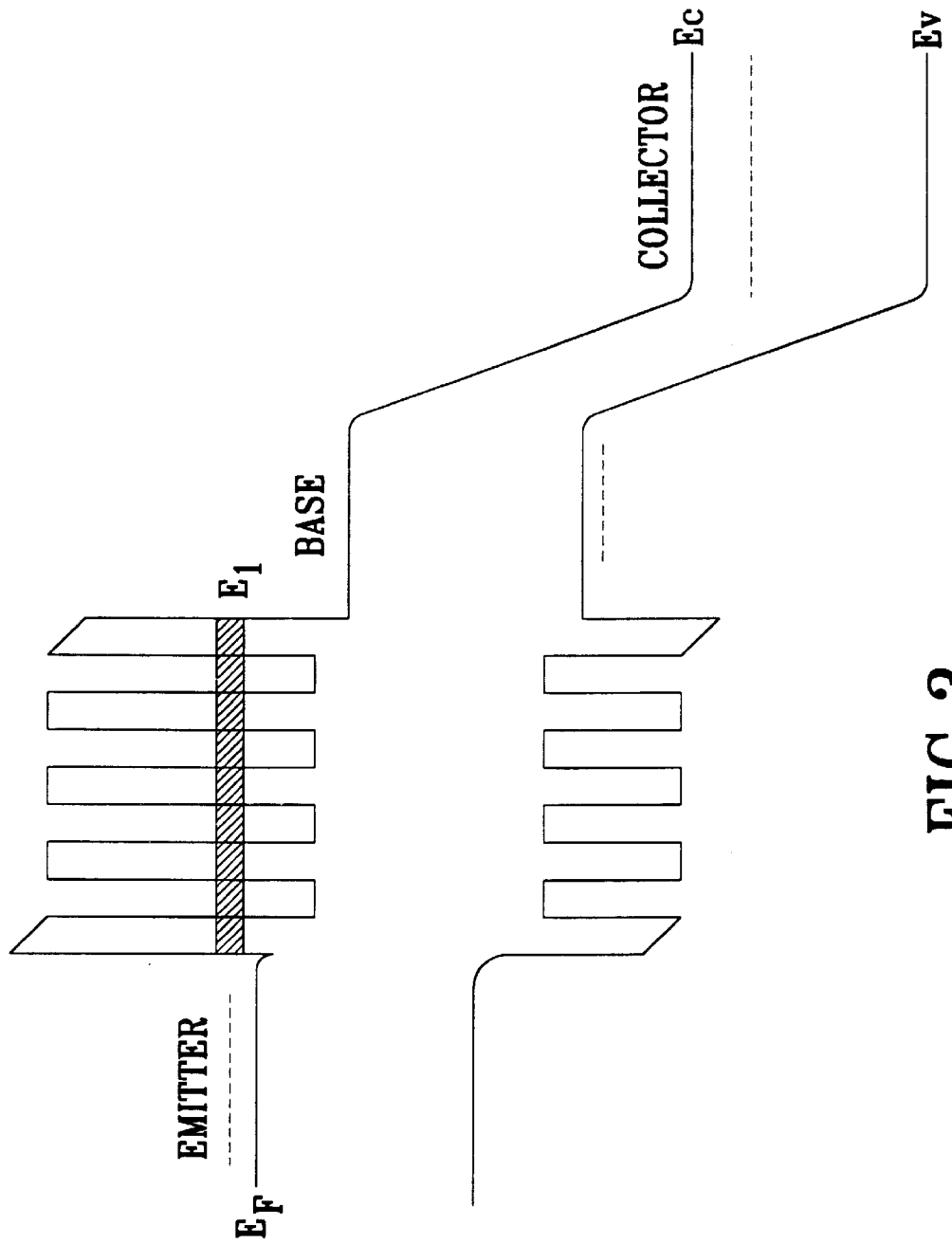
FIG. 3 is an energy band diagram of the GaInAs/AlInAs superlatticed negative-differential-resistance functional transistor under resonant tunneling of the present invention.

FIG. 2 indicates energy band of the present invention under thermal equilibrium. By probing into a multi-barrier tunneling model, transfer matrix, and theoretical analysis, a sub-band with resonant tunneling level $E_1$(123 meV) and full width at half maximum $\Delta E_1$(14 meV) is found in the super lattice region. The energy band under resonant tunneling is shown in FIG. 3.

Figure 4:
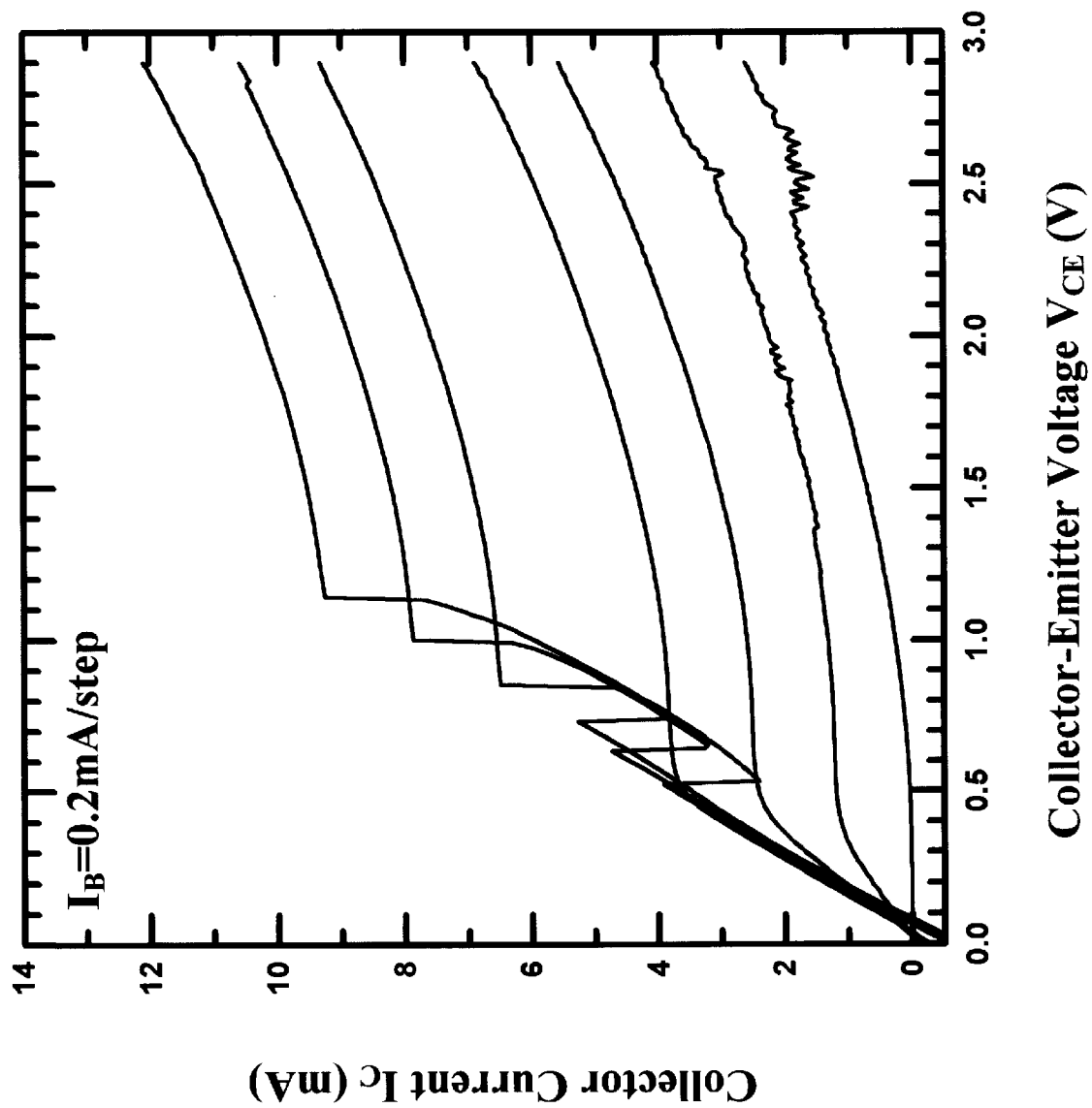
FIG. 4 is a output current-voltage characteristics of the GaInAs/AlInAs superlatticed negative-differential-resistance functional transistor of the present invention.

FIG. 4 shows current vs. voltage characteristics with common emitter of the element at room temperature (emitter area is 60×60 $\mu m^2$), where offset voltage is 55 mV, current gain 8, and a remarkable phenomenon of N-type negative-differential-resistance can be perceived in a larger base current region ($I_B \geq 0.8$ mA).

To our best knowledge, we regard the interesting phenomenon of negative-differential-resistance that comes from the resonant tunneling effect. When the base current is relatively small, base-emitter voltage $V_{BE}$ is smaller than the built-in voltage in a p-n junction, while base current becomes larger and larger, so $V_{BE}$ is changed accordingly until a flat band emerges at base-emitter interface, the element works as a common transistor in that duration. If $V_{BE}$ goes further larger, the Fermi's energy level in emitter region will be raised up till $E_F$ matches sub-band of the super lattice region when the resonant tunneling probability reaches its peak value, and so does the current.

Suppose $V_{BE}$ continues to increase to break down the matching relation between $_F$ and sub-band of the super lattice region, the resonant tunneling probability will be lessened to reduce tunneling current and the total current, to display the NDR phenomenon in current-voltage output characteristics. In addition, the element differs with some other resonant transistors in that the NDR phenomenon may appear in multiple I–V curves. In other words, the element has a three-terminal (external applied base current) controlled NDR phenomenon to significantly extend application field.

Many changes and modifications in the above-described embodiment of the invention can, of course, be carried out without departing from the scope thereof. Accordingly, to promote the promote the progress in science and the useful arts, the invention is disclosed and is intended to be limited only by the scope of the appended claims.

What is claimed is:

1. A GaInAs/AlInAs superlatticed negative-differential-resistance functional transistor, comprising:
   a substrate formed by Indium phosphide(InP) material;
   a buffer layer formed by GaInAs material;
   a collector layer formed by $n^+$ type GaInAs material;
   a base layer formed by GaInAs material;
   an emitter layer formed by GaInAs material;
   a short period super lattice resonant tunneling layer, wherein a barrier layer is formed by AlInAs material, a quantum well formed by GaInAs material; and
   an ohmic connection layer formed by GaInAs material.

2. The GaInAs/AlInAs superlatticed negative-differential-resistance transistor of claim 1, wherein the substrate is formed by $n^+$ type or i-type InP material.

3. The GaInAs/AlInAs superlatticed negative-differential-resistance transistor of claim 1, wherein the buffer layers is formed by $n^+$ GaInAs material.

4. The GaInAs/AlInAs superlatticed negative-differential-resistance transistor of claim 1, the collector layer is formed by n type GaInAs material.

5. The GaInAs/AlInAs superlatticed negative-differential-resistance transistor of claim 1, wherein the base layers is formed by $p^+$ GaInAs material.

6. The GaInAs/AlInAs superlatticed negative-differential-resistance transistor of claim 1, wherein the emitter layer is formed by n type GaInAs material.

7. The GaInAs/AlInAs superlatticed negative-differential-resistance transistor of claim 1, wherein the barrier layer of the short period super lattice resonant tunneling layer is formed by AlInAs material.

8. The GaInAs/AlInAs superlatticed negative-differential-resistance transistor of claim 1, wherein the quantum well of the short period super lattice resonant tunneling layer is formed by GaInAs material.

9. The GaInAs/AlInAs superlatticed negative-differential-resistance transistor of claim 1, wherein the ohmic connection layer is formed by n type GaInAs material.

10. The GaInAs/AlInAs superlatticed negative-differential-resistance transistor of claim 7, wherein the thickness of the barrier of the short period super lattice resonant tunneling layer is 40 Å to 60 Å without impurity.

11. The GaInAs/AlInAs superlatticed negative-differential-resistance transistor of claim 8, wherein the thickness of the quantum well of the short period super lattice resonant tunneling layer is 40 Å to 60 Å of n type.

12. The GaInAs/AlInAs superlatticed negative-differential-resistance transistor of claim 8, wherein the super lattice period scope of the above-said short period super lattice resonant tunneling layer is from 4 to 8.

* * * * *